United States Patent [19]
Bel

[11] Patent Number: 5,286,941
[45] Date of Patent: Feb. 15, 1994

[54] HIGH FREQUENCY HEATING GENERATOR HAVING AN IMPROVED MATCHING NETWORK BETWEEN A TETRODE AMPLIFIER AND A RESONANT CIRCUIT

[75] Inventor: Claude Bel, Maxilly, France

[73] Assignee: Thompson Tubes Electroniques, Boulogne Billancourt, France

[21] Appl. No.: 821,196

[22] Filed: Jan. 16, 1992

[30] Foreign Application Priority Data

Jan. 18, 1991 [FR] France ................ 91 00572

[51] Int. Cl.$^5$ ............................. H05B 6/04
[52] U.S. Cl. ................... 219/778; 219/121.36; 363/95; 323/237
[58] Field of Search ............ 219/10.77, 10.75, 10.81, 219/10.55 B, 14.36; 363/95, 96, 97, 98, 99, 36, 38; 323/237, 239, 246

[56] References Cited

U.S. PATENT DOCUMENTS

| | | | |
|---|---|---|---|
| 4,471,196 | 9/1984 | Frank et al. | 219/10.77 |
| 4,700,281 | 10/1987 | Thorn et al. | 363/96 |
| 4,704,673 | 11/1987 | Busch | 363/98 |
| 4,755,345 | 7/1988 | Baity, Jr. et al. | |

FOREIGN PATENT DOCUMENTS

| | | |
|---|---|---|
| 0113704 | 7/1984 | European Pat. Off. |
| 0157534 | 10/1985 | European Pat. Off. |
| 0238122 | 9/1987 | European Pat. Off. |
| 0405611 | 1/1991 | European Pat. Off. |
| 2-10687 | 1/1990 | Japan |
| 8912947 | 12/1989 | PCT Int'l Appl. |

*Primary Examiner*—Philip H. Leung
*Attorney, Agent, or Firm*—Oblon, Spivak, McClelland, Maier & Neustadt

[57] ABSTRACT

A high frequency heating generator which includes an electron tube amplifier, the output of which is connected to a resonant circuit that is electromagnetically coupled to a part to be heated, and a controlled frequency oscillator. The oscillator outputs a high frequency signal to the input of the amplifier. It also includes circuitry to measure the phase shift between the current output to the resonant circuit and the voltage at its terminals, and to modify the frequency of the oscillator as a function of this phase shift. The invention can be applied notably to devices for heating by electromagnetic induction, dielectric losses or plasma.

14 Claims, 4 Drawing Sheets

HIGH FREQUENCY HEATING GENERATOR HAVING AN IMPROVED MATCHING NETWORK BETWEEN A TETRODE AMPLIFIER AND A RESONANT CIRCUIT

BACKGROUND OF THE INVENTION

1. Field of the Invention

The present invention relates to high frequency heating generators. These generators may be used notably in devices that achieve heating by electromagnetic induction, dielectric losses or plasma.

Generators such as these generally have a resonant circuit that is electromagnetically coupled to a part to be heated, connected to an output of at least one electron tube mounted as a self-oscillator.

2. Description of the Prior Art

Heating by electromagnetic induction consists in causing a conductive part to get heated by the circulation of currents induced by a magnetic field. This method enables the part to be heated in its mass without direct contact with the energy source. The part to be heated (or the part subjected to induction) is surrounded by at least one winding for the circulation of current (or inductor). The working frequencies of the generator range from some tens of kilohertz to some megahertz. The power values needed range from some kilowatts to more than one megawatt. Heating by electromagnetic induction is used extensively in industry and in the scientific field. In industry, it is used notably in metallurgy to refine metals, conduct heat processing operations on metal parts or produce continuously welded tubes.

Heating by dielectric losses consists in causing an insulator part to get heated by prompting losses in its mass, through an AC electrical field. The part to be heated is a poor insulator. It is placed between two conductive plates supplied by an AC source. A capacitor is created, the dielectric of which is the part to be heated. The generators used generally have higher working frequencies than those of heating generators that work by electromagnetic induction. These frequencies may range from some tens of megahertz to some gigahertz. This mode of heating is used in the wood industry for drying or bonding, in the textile industry or in the manufacture or shaping of plastic materials.

Heating by plasma consists in ionizing a gas medium to convert it into plasma. The kinetic, energy gets converted into heat. There is a considerable considerably rise in temperature. The part to be heated is placed in the plasma. The conversion of the gas medium into plasma is obtained by an emission from an antenna. The working frequencies of the generator range from one megahertz to some tens of megahertz. This mode of heating is used in numerous industrial applications such as the melting of refractory products, chemical synthesis etc.

The performance values of high frequency heating generators are optimal if the load impedance presented to the electron tube is mttched at all times. The resonant circuit electromagnetically coupled to the part to be heated is equivalent either to a parallel R,L,C circuit or to a series R,L,C circuit. The overvoltage or quality factor Q of the resonant circuit is high, and mismatching is easy in the vicinity of the resonance frequency. For the load impedance presented to the tube to be matched, it should be real, and its modulus should have an optimal value for the tube. The load impedance is essentially variable for it depends on the characteristics of the elements constituting the resonant circuit and notably of the material of the part to be heated, their dimensions and their relative position. This position is important especially if the part to be heated is in motion, for example if it is an induction heated plate of sheet metal that is rolled and continuously welded.

Most of the characteristics vary also with temperature and time. The variation of the impedance leads to a variation of the resonance frequency of the resonant circuit. The performance characteristics of electron tubes are affected by these variations. Their efficiency deteriorates. Since the tube is used in a self-oscillator assembly, its working frequency is influenced by the resonance frequency of the resonant circuit without being thereby identical in any way. The variation of the resonance frequency may lead to a stalling of the oscillator which then ceases to oscillate. All these cases of mismatching necessitate an over-excitation of the tube which may damage it.

To match the load impedance presented to the tube, it is possible to insert commutable elements in a matching transformer interposed between the oscillator tube and the resonant circuit This matching is done before the start of the heating as a function of the assumed impedance that the load will have.

It is also possible to interpose a circuit comprising variable inductances and capacitances between the resonant circuit and the oscillator tube. These variable elements are permanently servo-linked so that the resonance frequency of the circuit is tuned to the chosen working frequency of the generator and so that the modulus of the impedance permanently keeps its optimum value. The servo-linking mechanisms are often electromechanical. This system is used when high power values are brought into play. The elements used are expensive for they are sized so as to receive high currents. They are bulky and introduce Joule effect losses that are not negligible.

SUMMARY OF THE INVENTION

The present invention seeks to overcome these drawbacks. It proposes a high frequency heating generator comprising an amplifier with at least one tetrode, the output of which is connected to a resonant circuit that is electromagnetically coupled to a part to be heated, and the working frequency of which is permanently matched with the frequency of the resonant circuit.

A controlled frequency oscillator outputs a high frequency signal designed to be transmitted to the input of the amplifier. A means is provided to measure the phase shift between the current output given to the resonant circuit and the voltage at its terminals, and to modify the frequency of the oscillator as a function of the phase shift.

The means to measure the phase shift is connected to receive, at one input, the voltage at the control gate of the tetrode and, at another input, the voltage at the terminals of the resonant circuit.

The means to measure the phase shift preferably includes a phase-voltage converter giving a voltage proportional to the phase difference $\Phi$ between the voltages applied to its inputs.

Preferably, the phase-voltage converter includes, at its input, a phase-shifter to add $\pi/2$ to the phase difference $\Phi$. This phase-shifter outputs two voltages, the phase difference of which is $\Phi + n/2$.

Preferably, a limiter amplifier circuit receives the two voltages phase-shifted by $\Phi + \pi/2$ and outputs two logic square-wave voltages representing the positive half periods of the voltages phase-shifted by $\Phi + \pi/2$, to a logic function that produces a voltage corresponding to the logical sum of the square-wave voltages.

A differential amplifier receives the output voltage of the logic function after integration at one input, and a constant voltage at another output, and outputs the voltage proportional to the phase difference $\Phi$.

The means used to modify the frequency of the oscillator preferably includes a summation device that receives, firstly, the voltage proportional to the phase difference $\Phi$ and, secondly, a set-value adjusting voltage, and outputs a control voltage to the oscillator.

A gain control element is preferably connected between the output of the oscillator and the input of the amplifier. A servo-control loop receives the voltage at the terminals of the resonant circuit and acts on the gain of the control element so as to maintain the amplitude of the voltage at the terminals of the resonant circuit at a value substantially equal to a constant chosen value. The servo-control loop preferably has an operational amplifier receiving, at one input, the voltage at the terminals of the resonant circuit and, at another input, a set-value voltage which is a function of the voltage to be obtained at the terminals of the resonant circuit.

Preferably, the gain control element comprises a capacitive divider, one arm of which is a varicap diode.

Preferably, a preamplifier is inserted between the gain control element and the input of the electron tube amplifier.

Preferably, an impedance transformer is connected between the electron tube and the resonant circuit.

When the heating generator heats by induction, the resonant circuit includes at least one loop for the circulation of current around the part to be heated.

When the heating generator heats by dielectric losses, the resonant circuit includes capacitor plates between which the part to be heated is placed.

When the heating generator heats by plasma, the resonant circuit includes an emission antenna that excites the plasma.

BRIEF DESCRIPTION OF THE DRAWINGS

The present invention shall be understood more clearly and other features and advantages shall appear from the following description, illustrated by the appended drawings, of which.

Figure 1:
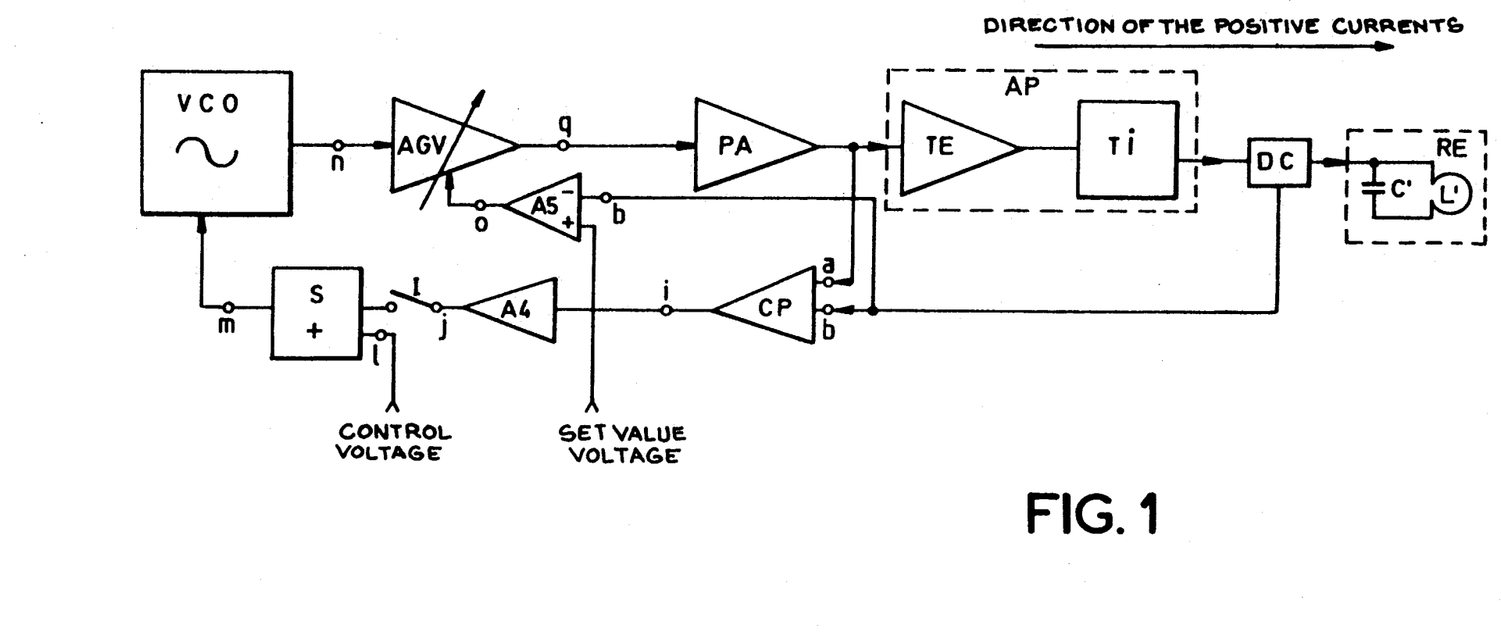
FIG. 1 shows an electrical diagram of a generator according to the invention.

In the figures, alphabetical indices are used to represent both the inputs and the outputs of the operators and the corresponding voltages, referenced in relation to the ground. In FIG. 1, the direction of the positive current is indicated at the output of the amplifier AP.

DETAILED DESCRIPTION OF THE INVENTION

FIG. 1 shows an electrical diagram of a high frequency heating generator according to the invention. The generator comprises an electron tube amplifier AP, the output of which supplies a resonant circuit RE electromagnetically coupled to a part to be heated. The resonant circuit is electrically equivalent to a parallel or series type R,L,C circuit. In the example described, the generator is a heating generator that works by induction. It could also be a heating generator working by dielectrical losses or plasma. There would be a difference in the resonant circuit, but this circuit would always be equivalent to an R,L,C type resonant circuit.

In the example described, the resonant circuit RE has at least one inductive loop L' surrounding the part to be heated, and at least one capacitor C' placed as close as possible to the inductive loop L'. The real part of the equivalent impedance representing the inductive loop L' coupled to the part to be heated corresponds to a resistor R' (not shown). By placing the capacitor C' as close as possible to the inductive loop L', limits are placed on the Joule effect losses in the links between the generator and the inductive loop L'.

The resonant circuit RE shown is equivalent to a parallel circuit. This is only an example. It could be equivalent to a series circuit.

A controlled frequency oscillator VCO provides gives a high frequency signal at the input of the amplifier AP.

The generator also includes a means to measure the phase shift between the current outputs given by the electron tube amplifier to the resonant circuit RE and the voltage at its terminals, and to modify the frequency of the oscillator VCO as a function of this phase shift.

A gain control element AGV is inserted between the controlled frequency oscillator VCO and the amplifier AP and a servo-control loop controlled by a set-value voltage is used to keep the amplitude of the voltage at the terminals of the resonant circuit substantially constant, at a chosen value. The set-value voltage is a function of the power to be supplied in the part to be heated.

At least one preamplifier PA is inserted between the output of the gain control element AGV and the input of the electron tube amplifier AP. At high power, a transistor-based preamplifier suffices. For very high power applications, it may be necessary to connect an additional preamplifier, with an electron tube, at the output of the transistor-based preamplifier. The matching between the additional preamplifier and the electron tube is then a wideband matching.

The power amplifier AP includes at least one electron tube. This tube is preferably a tetrode TE with high gain and high efficiency. It is used in a cathode-to-ground assembly. An impedance transformer Ti is connected between the anode of the tube and the resonant circuit RE. This fixed or variable transformer is used for the matching of the modulus of the load impedance presented to the electron tube. It has a quality factor which is far lower than that of the resonant circuit RE.

The development of the resonance frequency of the resonant circuit RE is controlled by the measurement of the phase-shift between the current output given by the tube to the resonant circuit RE and the voltage at the terminals of the resonant circuit RE. The fundamental component of the current output to the resonant circuit has the same phase as the voltage at the control gate of the electron tube TE, the impedance transformer. Ti making it possible to compensate for the n phase shift introduced by the electron tube TE according to the sign convention of the currents and voltages. It is possible to envisage a case where the impedance transformer Ti does not have this compensation characteristic. This variant shall be described further below. For greater clarity, it shall be assumed, as of now in the present description, that the impedance transformer Ti compensates for the n phase-shift. The measured phase shift is made to have a value of zero by the modification of the working frequency of the electron tube amplifier through the controlled frequency oscillator VCO. The working frequency of the amplifier AP becomes substantially equal to that of the resonant circuit RE.

A voltage divider DC is inserted between the amplifier AP and the resonant circuit RE. This divider is used to pick up a part of the voltage at the terminals of the resonant circuit RE. It is preferably capacitive but could be inductive or resistive.

If the resonant circuit is a parallel circuit (as shown in FIG. 1) and if the current output to the resonant circuit RE is in advance with respect to the voltage at the terminals of the resonant circuit RE, it means that the working frequency of the generator is greater than the resonance frequency of the resonant circuit RE. If the resonant circuit RE were to be a series circuit, the working frequency of the generator would be smaller than the resonance frequency of the resonant circuit RE.

The phase difference $\Phi$ between the voltage at the control gate of the tube and the voltage at the terminals of the resonat circuit is given by:

$$\Phi = Arctan\ Q\ (w/wo - wo/w)$$

where Q is the quality factor of the resonant circuit RE, w is the pulsation of the current output to the resonant circuit RE, wo is the pulsation at the resonance of the resonant circuit RE. The two voltages are in phase if w=wo.

Figure 2:
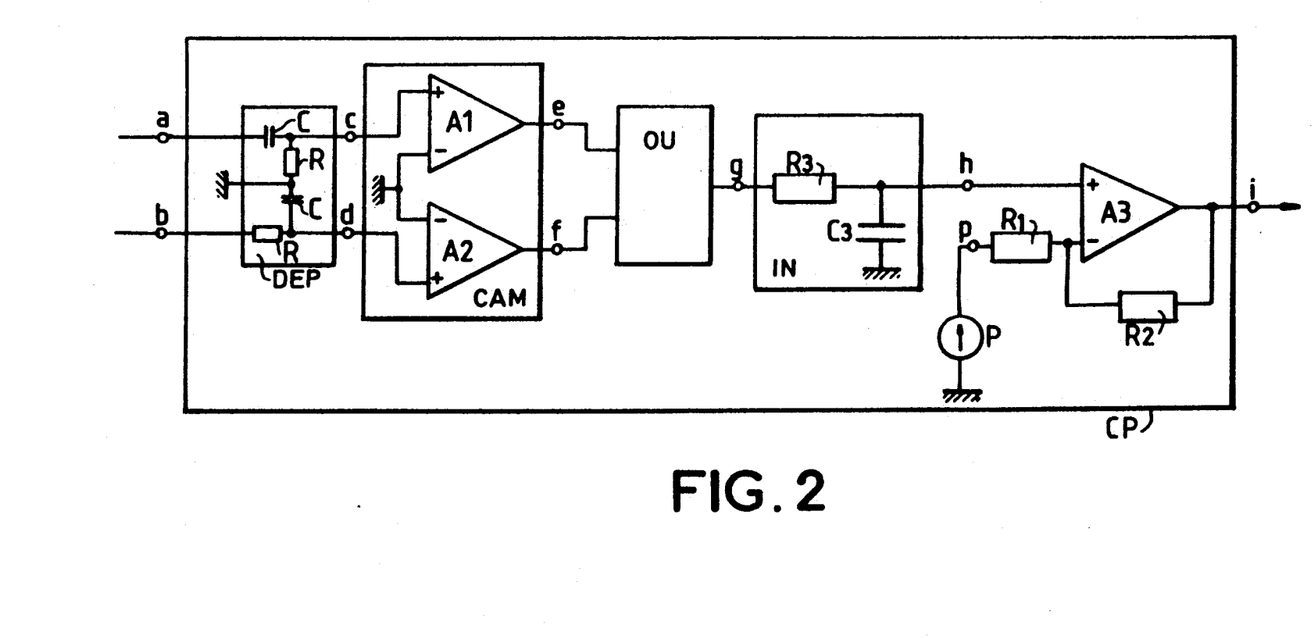
FIG. 2 shows an electrical diagram of the phase-voltage converter.

The means to measure the phase-shift includes a phase-voltage converter CP. The phase-voltage converter CP is shown in FIG. 2. The phase-voltage converter is aperiodic and ineensitive to the variations in amplitude of the voltages that are applied to it.

The voltages present at the control gate of the tetrode TE and at the terminals of the resonant circuit RE are applied respectively to the two input terminals a, b of the phase-voltage converter CP.

It is assumed that the voltage at the resonant control gate is delayed by to with respect to the voltage at the terminals of the resonant circuit.

The two voltages may be written as follows:

$$a = x\ sin\ [(2\pi/T)\ (t-to)]$$

$$b = y\ sin\ (2\pi t/T)$$

or else again:

$$a = x\ sin\ (wt + \Phi)$$

$$b = y\ sin\ wt$$

Figure 3A:
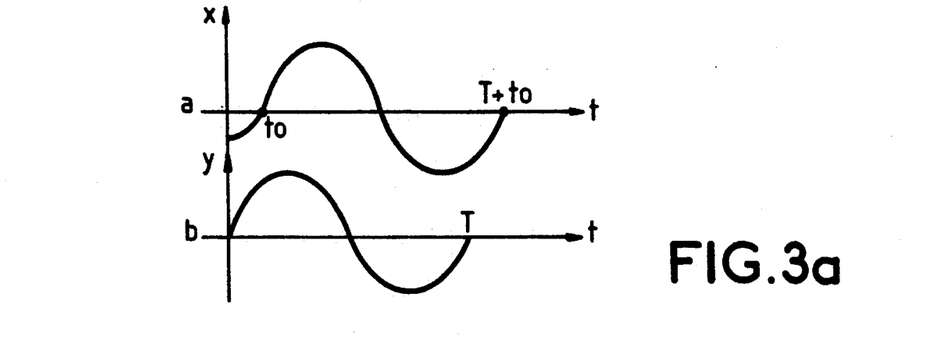
FIG. 3a shows the voltages a and b, as a function of time, applied to the input of the phase-shifter contained in the phase-voltage converter.

These two voltages are shown, in FIG. 3a. The phase-voltage converter CP provides, at its output i, a DC voltage with an amplitude proportional to $\Phi$, hence to to/T and independent of the amplitudes x and y.

The input of the phase-voltage converter CP is taken at a phase-shifter DEP. The role of the phase-shifter DEP is to keep one of the voltages in a phase lead with respect to the other one, for all the values of the phase difference $\Phi$ which are always between $-\pi/2$ and $+\pi/2$. This condition makes it possible to know the sign of the phase difference $\Phi$ between the voltages a and b at the output of the phase-voltage converter CP. The phase-shifter DEP receives the voltages a and b at two inputs and outputs two voltages c and d at two output terminals the voltage c being in advance of the voltage d for all the values of the phase difference $\Phi$. The phase-shifter DEP introduces an additional phase shift of n/2 between the voltages c and d.

$$c = x'sin\ [(2\pi/T)\ (t + T/4 - to)]$$

$$c = x'sin\ [(2\pi/T)\ (t + t1)]$$

with $t1 = T/4 - to$ $$d = y'sin\ (2\pi t/T)$$

Figure 3B:
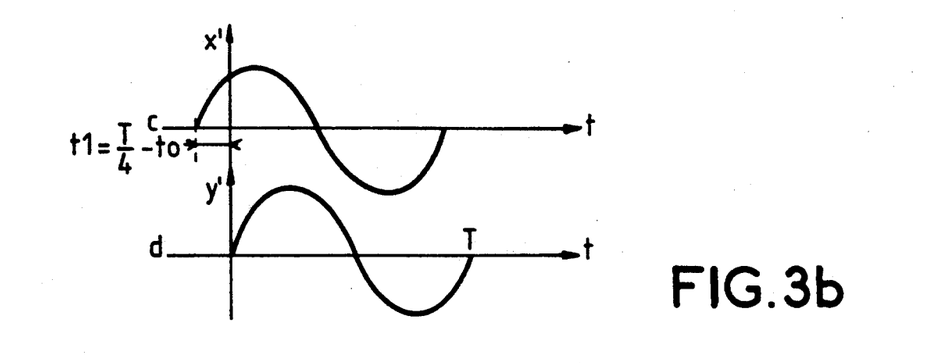
FIG. 3b shows the voltages c and d, as a function of time, present at output of the phase-shifter.

The voltages c and d are shown in FIG. 3b.

This phase-shifter DEP has two networks, R, C, reversed with respect to each other (the first one with input on resistor and the second one with input on capacitor). The voltage c has a phase lead with respect to the voltage a by a value $\Phi 1 = arctan\ 1/RCw$.

The voltage d has a phase delay with respect to voltage b by a value $\Phi 2 = -arctan\ RCw$.

The phase difference between c and d is then:

$$\Phi + \Phi - \Phi 2$$

with $\Phi 1 - \Phi 2 = Arctan\ 1/RCw + Arctan\ RCw$, then $\Phi 1 - \Phi 2$ is equal to $\pi/2$ irrespectively of the value of RCw.

A limiter amplifier circuit CAM is connected to the output of the phase-shifter DEP. This limiter amplifier circuit CAM has two differential amplifiers A1, A2 respectively receivin the voltages c and d at their non-inverting inputs. Their inverting inputs are grounded.

Figure 3C:
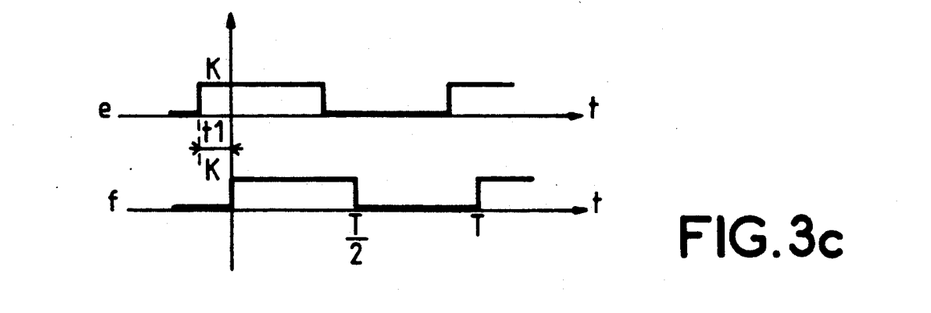
FIG. 3c shows the voltages e and f, as a function of time, these square-wave voltages corresponding to the positive half periods of the voltages c and d.

They respectively output two clipped square-wave voltages e,f, with a constant amplitude K. The duration of these square-wave voltages is half a period of the voltages c and d. The voltages e and f are respectively in phase with the voltages c and d. The square waves correspond to the positive part of the voltages c and d. The voltages e and f are shown in FIG. 3c.

Figure 3D:
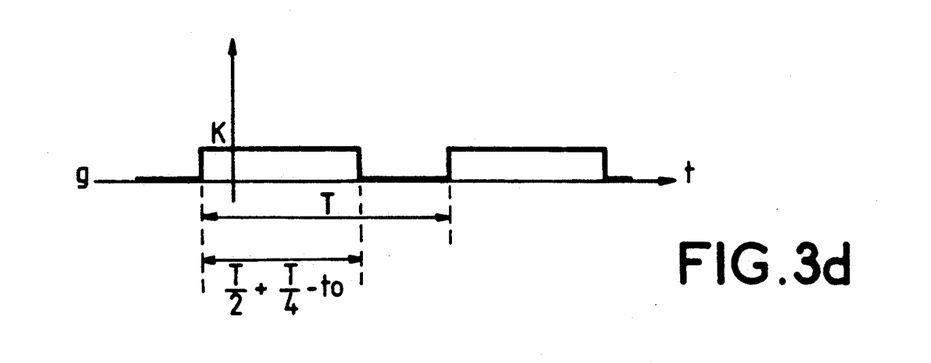
FIG. 3d shows the voltage g, as a function of time, present at output of the logic function contained in the phase-voltage converter.

The amplitude of the voltages e and f is equal to the constant K when the amplitude of the voltages c and d is positive. The voltage e is in advance of the voltage f by $t1 = T/4 - to$. The voltages e and f are applied to both inputs of a logic function. Here, this is a logic OR circuit which gives, at its output g, a voltage that corresponds to the logical logic sum of the voltages e and f. The duration of a square wave pulse is equal to $T/2 + T/4 - to$. The voltage g is shown in FIG. 3d.

The voltage g supplies an integrator IN. This is a circuit R3, C3, the time constant of which is great as compared with the period T. This integrator IN outputs a voltage h that corresponds to the mean value of the voltage g. This voltage h varies as the phase difference Φ but has its origin shifted by 3K/4 when Φ gets cancelled. The voltage h is injected into the non-inverting terminal of a differential amplifier A3 which receives, at its inverting terminal, a voltage p with a constant amplitude, through a resistor R1. It gives the voltage i. The amplifier A3 has a feedback resistor R2 between the inverting input and the output i.

The output voltage i of the differential amplifier A3 has the value:

$$i = [(R1+R2)/R1] \cdot [3K/4 - Kto/T] - R2p/R1$$

In appropriately choosing the value of p, it is possible to get rid of the offset voltage 3K/4 so that the voltage i is proportional to the phase difference Φ.

This appropriate value of p is:

$$p = (3K/4) [(R1/R2) + 1]$$

The voltage i then becomes:

$$i = -[(R1+R2)/R1] K (to/T)$$

This voltage i is proportional to $-to/T$, hence to the phase difference Φ.

When the impedance transformer TI does not compensate for the phase-shift $\pi$ between the current given to the resonant circuit RE and the voltage on the control gate of the tube TE, the voltages present at the control gate of the tetrode TE and at the terminals of the resonant circuit are respectively:

$$a = x \sin (wt + \Phi + \pi)$$

$$b = y \sin wt$$

The output voltage i of the phase-voltage converter CP then becomes:

$$i = [(R1+R2)/R1] K (t0/T)$$

To re-establish the sign of the voltage i, it is enough to invert the voltages at the inputs a and b of the phase-voltage converter CP.

At equilibrium, when the phase difference Φ gets cancelled, the voltage at the control gate of the tube TE is in phase opposition with the voltage at the terminals of the resonant circuit.

This voltage i is used to modify the frequency of the oscillator VCO. This voltage i is injected into an amplifier A4. The gain G of the amplifier A4 is determined so as to obtain a maximum phase difference, smaller than a given limit throughout the range of the variations of the resonance frequency of the resonant circuit RE.

The output of the amplifier A4 supplies, through a switch I, a first input j of a summation device S. A second input of the summation device S receives a set-value adjusting voltage 1.

The voltage j is equal to the voltage i amplified when the switch i is closed. The summation device S outputs a voltage m for the control of the oscillator VCO.

$$j = Gi$$

$$m = j + 1$$

The voltage 1 is adjusted in an open loop (1 open) so that the frequency of the VCO oscillator approaches the maximum theoretical value of the resonance frequency of the resonant circuit RE. A pre-setting of the frequency of the oscillator VC0 is done.

The maximum phase difference obtained in a closed loop depends on the gain G and on the characteristics of the oscillator VCO and the phase-voltage converter CP.

A heating generator according to the invention has been tried. Its characteristics are as follows:

* quality factor of the resonant circuit:

$$Q = 60$$

* pre-setting frequency of the oscillator VCO (in open loop):

$$f' = 2{,}500 \text{ kHz}$$

* resonance frequency of the resonant circuit, at a given instant:

$$fo = 2{,}550 \text{ kHz}$$

* characteristic of the oscillator VCO:

$$dfg/dV \text{ controlled} = 40.6 \text{ kHz/V around 2 500 kHz}$$

* characteristic of the phase-voltage converter:

$$133 \text{ mV/degree}$$

* maximum phase difference permitted:

$$-1.5° < \Phi_{max} < +1.5°$$

The corresponding phase difference in an open loop (before the correction) is:

$$\Phi = \text{Arctan } 60 \, [(2500/2550 - 2550/2500)] = -67°$$

In a closed loop, the maximum phase difference permitted is equal, in this case, to $-1.5°$; it corresponds to a difference in frequency of $-0.5$ kHz.

The working frequency f' of the amplifier and of the oscillator VCO should be 2,549.5 kHz after correction.

The frequency output by the oscillator VCO should be increased by 49.5 kHz.

This increase corresponds to an increase dm in the voltage m:

$$dm = (49.5 \text{ kHz}. \ 1 \text{ V})/40.6 \text{ kHz} = 1.22 \text{ V}$$

The voltage m comes from the summation device S and is equal to:

$$m = j + 1 = Gi + 1$$

The voltage 1 is constant, adjusted before use, then:

$$dm = Gi$$

i is the output voltage of the phase-voltage converter for a phase difference Φ of $-1.5°$ $$i = -1.5° \cdot 133 \text{ mV}/1° = -0.2 \text{ V}$$

The gain G to be given to the amplifier A4 is equal to:

$$G = -1.22/0.2 = -6.1$$

The frequency error in a closed loop is about hundred times smaller than that obtained without servo-control.

If the generator according to the invention is used to heat different parts per production cycle, or if it uses different inductors in the event of heating by induction, the load impedance presented to the tube is different at each cycle. To optimize the output of the generator, it is possible, before the start of the cycle, to make an appropriate adjustment in the impedance transformer Ti so as to be closer to the matching conditions. The matching transformer Ti is then variable. The primary of the matching transformer Ti generally includes at least one element that can be commutated by means of a connector, to carry out the pre-setting.

The power used to heat the part depends on the voltage at the terminals of the resonant circuit RE. To control this power, it is enough to control the amplitude of the voltage at the terminals of the resonant circuit RE.

Figure 4:
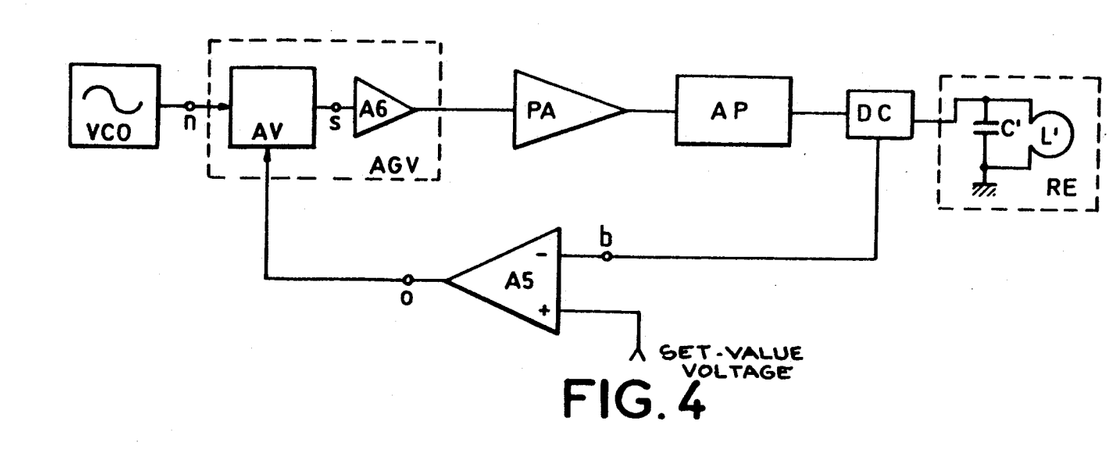
FIG. 4 shows an electrical diagram of the gain control element and of the servo-control loop.

To this end, the generator according to the invention also has a gain control element AGV between the output n of the oscillator VCO and the input of the amplifier AP, and a servo-control loop. The servo-control loop has an amplifier A5 receiving, at its inverting input, the voltage a at the terminals of the resonant circuit RE and, at its non-inverting input, a set-value voltage that is a function of the power desired in the part to be heated. This variable gain element and this servo-control loop are shown in FIG. 4. The amplifier A5 outputs a control voltage o to the gain control element AGV. This gain control element is a variable gain amplifier.

The control voltage o acts on the gain of the variable gain amplifier AGV in a direction that tends to keep the amplitude of the voltage at the terminals of the resonant circuit RE constant, at a chosen value. The voltage at the terminals of the resonant circuit RE is servo-linked to the set-value voltage.

The variable gain amplifier AGV includes a variable attenuator AV, the output s of which is connected to an impedance matching amplifier A6.

Figure 5:
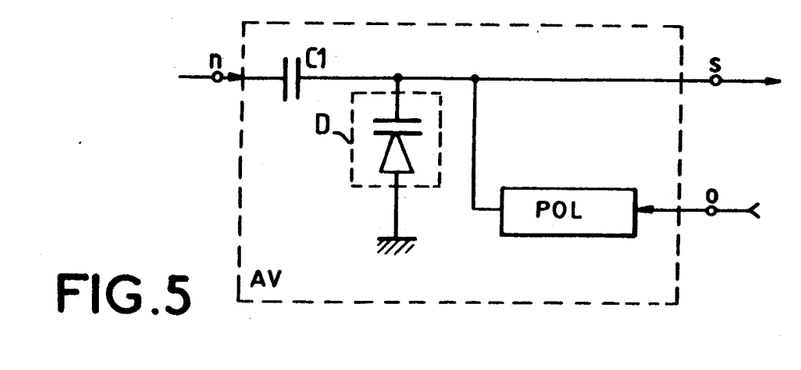
FIG. 5 shows an electrical diagram of the variable attenuator contained in the gain control element.

The variable attenuator AV is shown in FIG. 5. It has a capacitive divider bridge (C1, D), one arm of which comprises a varicap diode D, and a biasing circuit POL for the varicap diode D.

The other arm of the divider bridge has a capacitor C1 having one end connected to the output n of the oscillator VCO and the other end connected to the cathode of the varicap diode D. The anode of the varicap diode D is grounded. The output s of the variable attenuator AV is connected to the cathode of the varicap diode D.

The bias circuit POL for the varicap diode D is connected between the cathode of the varicap diode D and the output o of the amplifier A5. For a given bias voltage, the varicap diode has a capacitance C2.

The input impedance of the amplifier A6 and the resistance of the bias circuit POL are great as compared with the value $1/C2.w$.

The attenuation of the variable attenuator is given by:

$$s/n = 1/[1+(C2/C1)]$$

It is independent of w, hence of the frequency.

The known generators are made from tube-based self-oscillators. The self-oscillators can b adjusted in power only by modifying the anode voltage. They necessitate continuously controllable supplies, with thyristor based devices. These supplies are very costly.

Since the generator according to the invention has an electron tube amplifier, the output power of the generator becomes easily controllable as regards the voltage given by the pre-amplifier Pa and applied to the gate of the tube. The anode voltage does not need to be continuously controllable as in the prior art.

The anode voltage may be fixed or variable by the commutation of contacts. If it can be commutated by means of contacts, it enables the efficiency to be maintained without modifying the load impedance presented to the tube. This has the same effect as the impedance transformer Ti which can be commutated by means of a connector. In any case, the cost of the anode supply is considered less than that of a continuously variable supply. This reduces the cost of the generator in a non-negligible way.

The high frequency heating generator described enables the heating of a part by induction.

It could also be used to heat a part by dielectric losses. Only the resonant circuit would be modified. It would comprise at least two plates between which the part to be heated would be placed.

It could also be used to heat a part by plasma. In this application, the resonant circuit would include an emission antenna.

What is claimed is:

1. A high frequency heating generator, comprising:
   an amplifier having an input and an output, the output being connected to a resonant circuit that is electromagnetically coupled to a part to be heated;
   a controlled frequency oscillator, connected to said amplifier, having an output terminal for outputting a high frequency signal to the input of the amplifier, wherein the amplifier includes at least one tetrode having a control gate; and
   means for measuring a phase shift between a current output from said tetrode to the resonant circuit and a voltage across a pair of terminals of the resonant circuit, and for modifying the frequency signal output by the oscillator as a function of said phase shift, the means for measuring said phase shift having a first input connected to the control gate of the tetrode and a second input connected to the terminals of the resonant circuit.

2. A high frequency heating generator according to claim 1, wherein the means for measuring the phase shift includes a phase-voltage converter which outputs a voltage proportional to a phase difference $\phi$ between first and second voltages applied to said first and second inputs thereof, wherein said first and second voltages are output to said first and second inputs of the phase-voltage converter from said control electrode of the tetrode and the terminals of the resonant circuit, respectively.

3. A high frequency heating generator according to claim 2, wherein the phae-voltage converter includes, connected to said first and second inputs thereof, a phase-shifter for adding $\pi/2$ to the phase difference $\phi$, said phase-shifter having first and second outputs connected to first and second inputs of a limiter amplifier circuit, respectively, for providing first and second voltages to said limiter amplifier circuit, the phase difference of which is $\phi + \pi/2$.

4. A heating generator according to claim 3, wherein said limiter amplifier circuit receives the first and second voltages from said phase-shifter which are phase-shifted by $\phi + \pi/2$ and outputs two logic square-wave voltages representing the positive half periods of the voltages phase-shifted by $\phi + \pi/2$ to a logic circuit, said logic circuit producing a voltage corresponding to the logical sum of the two logic square-wave voltages.

5. A heating generator according to claim 4, wherein a differential amplifier receives the output voltage of the logic circuit after integration at a first input thereof, and a constant voltage at a second input thereof, and outputs a voltage proportional to the phase difference $\phi$.

6. A heating generator according to any one of claim 1-5, wherein the means for modifying the frequency of the oscillator as a function of the phase-shift includes a summation device, having first and second inputs and an output, which receives the voltage output from the phase-voltage converter at a first input thereof, and receives a set-value adjusting voltage at a second input thereof, and outputs a control voltage to an input of the oscillator.

7. A heating generator according to claim 1, wherein a gain control element is connected between the output terminal of the oscillator and the input of the amplifier, and wherein a servo-control loop connected to the terminals of the resonant circuit at one end of the loop, and connected to said gain control element at a second end thereof, varies the gain of the gain control element so as to maintain the amplitude of the voltage at the terminals of the resonant circuit at a value substantially equal to a constant predetermined value.

8. A heating generator according to claim 7, wherein the servo-control loop includes an operational amplifier receiving, at one input thereof, the voltage at the terminals of the resonant circuit and, at a second input thereof, a set-value voltage which is a function of a target voltage desired to be obtained at the terminals of the resonant circuit.

9. A heating generator according to either of claim 7, or 8, wherein the gain control element comprises a capacitive divider for receiving said high frequency signal output by said oscillator and outputting a signal to an impedance matching amplifier included in said gain control element, said impedance matching amplifier outputting a signal to said amplifier connected to the resonant circuit, one arm of said capacitive divider being a varicap diode.

10. A heating generator according to claim 7, wherein a preamplifier is connected between the gain control element and the input of the amplifier connected to the resonant circuit, wherein said preamplifier is provided for impedance matching of said gain control element and said amplifier connected to the resonant circuit.

11. A heating generator according to claim 1, wherein an impedance transformer is connected between the tetrode and the resonant circuit in order to compensate for phase shifts generated by said tetrode.

12. A heating generator according to claim 1, wherein the resonant circuit includes at least one loop for the circulation of current around the part to be heated.

13. A heating generator according to claim 1, wherein the resonant circuit includes capacitor plates between which the part to be heated is placed.

14. A heating generator according to claim 1, wherein the resonant circuit includes an emission antenna for exciting plasma used to heat the part to be heated.

* * * * *